(12) United States Patent
Sako

(10) Patent No.: US 10,014,763 B2
(45) Date of Patent: Jul. 3, 2018

(54) PROTECTION CIRCUIT FOR SEMICONDUCTOR SWITCHING ELEMENT, AND POWER CONVERSION DEVICE

(71) Applicant: MEIDENSHA CORPORATION, Tokyo (JP)

(72) Inventor: Hiromi Sako, Numazu (JP)

(73) Assignee: MEIDENSHA CORPORATION, Tokyo (JP)

( * ) Notice: Subject to any disclaimer, the term of this patent is extended or adjusted under 35 U.S.C. 154(b) by 216 days.

(21) Appl. No.: 15/034,952

(22) PCT Filed: Nov. 6, 2014

(86) PCT No.: PCT/JP2014/079410
§ 371 (c)(1),
(2) Date: May 6, 2016

(87) PCT Pub. No.: WO2015/068755
PCT Pub. Date: May 14, 2015

(65) Prior Publication Data
US 2016/0276921 A1    Sep. 22, 2016

(30) Foreign Application Priority Data
Nov. 8, 2013  (JP) ................. 2013-231641

(51) Int. Cl.
*H02M 1/32*  (2007.01)
*H03K 17/16*  (2006.01)
(Continued)

(52) U.S. Cl.
CPC ............. *H02M 1/32* (2013.01); *H02M 1/08* (2013.01); *H03K 17/0828* (2013.01); *H03K 17/107* (2013.01); *H03K 17/168* (2013.01)

(58) Field of Classification Search
CPC .......... H02M 1/08; H02M 1/32; H02M 1/088; H02M 1/00; H03K 17/0828;
(Continued)

(56) References Cited

U.S. PATENT DOCUMENTS 5,920,224 A * 7/1999 Preslar ............... H03K 17/166
                                                    327/110
6,373,731 B1    4/2002 Iwamura et al.
(Continued)

FOREIGN PATENT DOCUMENTS

DE    196 40 433 A1    4/1998
DE    197 40 540 C1    3/1999
(Continued)

OTHER PUBLICATIONS

Shammas N. Y. A. et al., Review of Series and Parallel Connection of IGBTs, IEE Proceedings: Circuits Devices and Systems, Institute of Electrical Engineers, vol. 153, No. 1, Feb. 16, 2006, pp. 34-39.
(Continued)

*Primary Examiner* — Thienvu Tran
*Assistant Examiner* — Nicolas Bellido
(74) *Attorney, Agent, or Firm* — Foley & Lardner LLP

(57) ABSTRACT

Upon turn-off of IGBT, by suppressing variations in collector-emitter voltage between IGBTs connected in series, risk of breaking IGBT due to overvoltage breakdown can be reduced. In protection circuit provided for each of the plurality of IGBTs 50 connected in series, between collector and emitter of IGBT 50, avalanche elements D1~D5, resistance R4 and avalanche element D6 are sequentially connected in series. Capacitor C1 and resistance R1 are connected parallel between both ends of the avalanche element D4, and capacitor C2 and resistance R2 are connected parallel between both ends of the avalanche element D5. Between a common connection point of the resistance R4
(Continued)

CIRCUIT OF THE PRESENT INVENTION and the avalanche element D6 and gate of the IGBT 50, resistance R5, a parallel circuit of capacitor C3 and resistance R6, and a series component of Zener diodes ZD1 and ZD2 whose polarities are opposite to each other, are connected in series.

8 Claims, 6 Drawing Sheets

(51) Int. Cl.
*H02M 1/08* (2006.01)
*H03K 17/082* (2006.01)
*H03K 17/10* (2006.01)

(58) Field of Classification Search
CPC .. H03K 17/107; H03K 17/168; H03K 17/828; H03K 17/10; H03K 17/08; H03K 17/082; H03K 17/16
See application file for complete search history.

(56) References Cited

U.S. PATENT DOCUMENTS

| | | | | |
|---|---|---|---|---|
| 6,385,028 B1* | 5/2002 | Kouno | ................ | H01L 27/0629 257/E27.016 |
| 6,531,908 B1* | 3/2003 | Goeser | ................ | H03K 17/0822 327/309 |
| 7,414,867 B2 | 8/2008 | Hussein et al. | | |
| 8,283,896 B1* | 10/2012 | Goluszek | ................ | H02J 7/345 320/140 |
| 8,780,516 B2* | 7/2014 | Wagoner | ................ | H02M 1/08 361/111 |
| 2003/0086227 A1* | 5/2003 | Coiret | ................ | H03K 17/0828 361/91.5 |
| 2007/0159751 A1 | 7/2007 | Hussein et al. | | |
| 2013/0015888 A1* | 1/2013 | Chan | ................ | H02M 1/36 327/109 |

FOREIGN PATENT DOCUMENTS

| | | | |
|---|---|---|---|
| JP | 2003-23769 | A | 1/2003 |
| JP | 2003-199325 | A | 7/2003 |
| JP | 3462032 | B2 | 11/2003 |
| JP | 3598933 | B2 | 12/2004 |
| JP | 3632385 | B2 | 3/2005 |
| JP | 2008-42950 | A | 2/2008 |
| JP | 2010-124643 | A | 6/2010 |
| JP | 2013-207553 | A | 10/2013 |
| JP | 2013207553 | A * | 10/2013 |
| RU | 2 208 290 | C2 | 7/2003 |
| WO | WO 98/59420 | A1 | 12/1998 |

OTHER PUBLICATIONS

Extended European Search Report, dated May 31, 2017, 10 pages.
Semikron Inc., Module Application Note of GBT, MOSFET, HP Technical Information, http://www.semikron.com/skcompub/ja/application_manual_2000-193.htm, Oct. 24, 2013 Search.

* cited by examiner

CIRCUIT OF THE PRESENT INVENTION

CIRCUIT CONFIGURATION OF RELATED ART

CIRCUIT CONFIGURATION OF RELATED ART

CIRCUIT CONFIGURATION OF RELATED ART

COMBINATION CIRCUIT OF Vce OVERVOLTAGE PROTECTION CIRCUIT AND Vge OVERVOLTAGE PROTECTION CIRCUIT

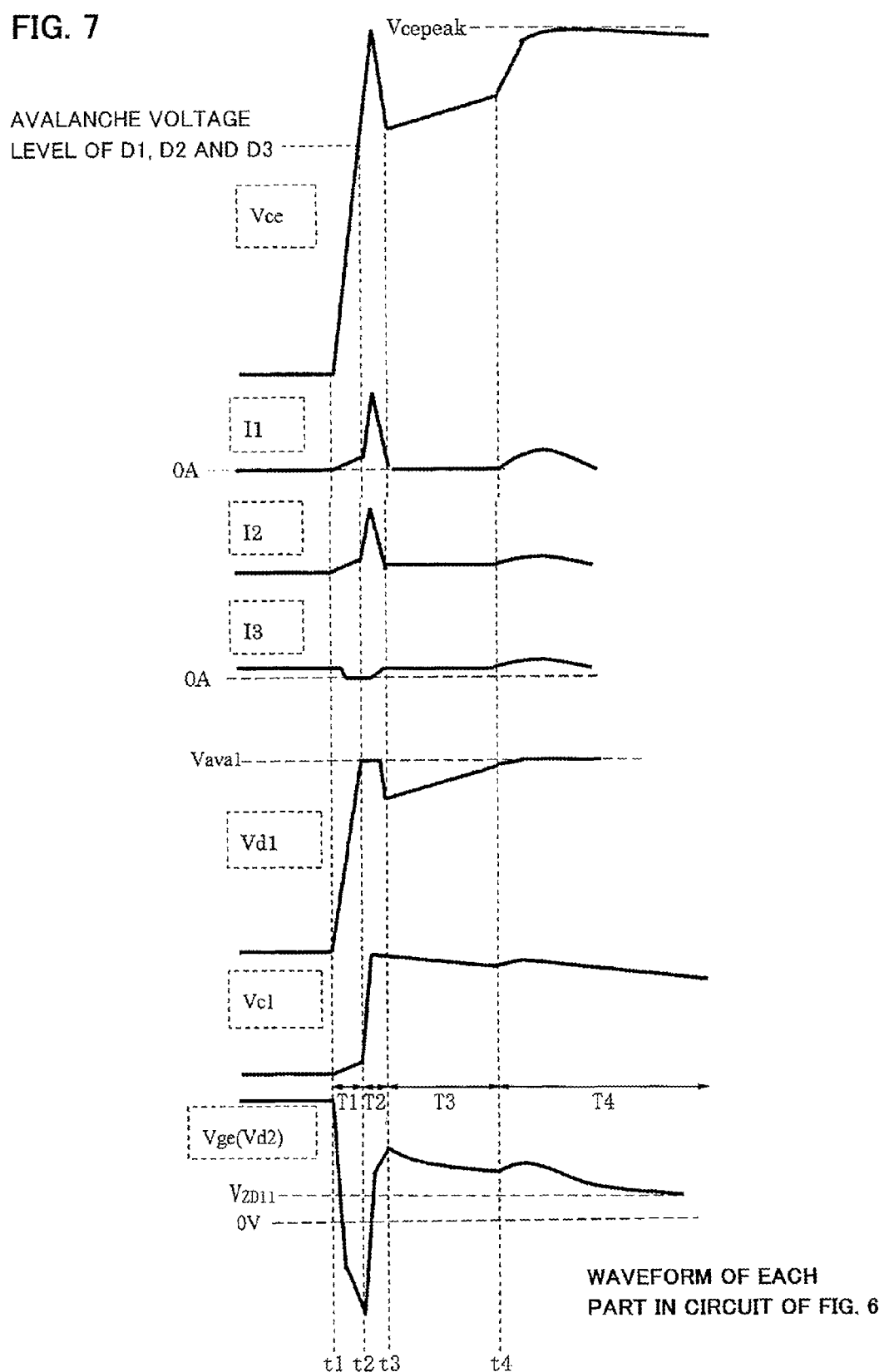

PROTECTION CIRCUIT FOR SEMICONDUCTOR SWITCHING ELEMENT, AND POWER CONVERSION DEVICE

TECHNICAL FIELD

The present invention relates to a power conversion device using a voltage-driven switching element, and more particularly to a protection circuit for a semiconductor switching element and a power conversion device.

BACKGROUND ART

There is a case where as a means to increase voltage of a power conversion device, a circuit configuration in which a plurality of semiconductor switching elements (e.g. IGBTs) are connected in series is applied. The switching element is brought into ON/OFF states by ON/OFF of a gate command inputted to a gate terminal of the switching element.

When the gate commands of the switching elements connected in series are simultaneously changed to OFF, breakdown of the switching element might occur due to a difference of agate command timing and/or a difference in voltage between the switching elements during a tail current period.

Patent Document 1 has proposed a technique of equalizing a collector-emitter voltage (a voltage between the collector and an emitter) of the switching element connected in series by applying, between a collector terminal and a gate terminal of the switching element, a protection circuit configured by a resistance and a capacitor. FIG. 3 shows a circuit configuration proposed in Patent Document 1.

In FIG. 3, in an IGBT module 15, an IGBT 17 and a diode 18 are connected parallel in reverse, and a collector terminal C, an emitter terminal E, a gate terminal G and a control emitter terminal E1 are provided. The IGBT 17 becomes ON or OFF on the basis of a gate voltage Vg applied across terminals G and E through a resistance 21, and a state between C-E terminals of the IGBT module 15 is brought into an ON state or an OFF state, thereby performing a switching operation. Here, a reference sign 19 denotes a gate capacitance of the IGBT module 15, and reference signs 20 and 20a denote floating inductances (or stray inductances) appearing in a wiring inside the IGBT module 15.

A resistance 23 and a capacitor 22, as the protection circuit, are connected in series between the collector terminal C and the gate terminal G of the IGBT 17.

Further, Patent Documents 3 and 4 have proposed a technique of applying a protection circuit in which an element having avalanche characteristics and a capacitor are combined. In addition, Patent Documents 5 and 6 have proposed a protection circuit in which an avalanche element, a resistance and a capacitor are combined.

FIG. 4 shows a circuit configuration proposed in Patent Document 5. In FIG. 4, an inductive load L whose one end is connected to a DC voltage source +V is connected, at the other end thereof, to a drain Dr of a field-effect transistor T. Between the drain Dr and a gate G of the field-effect transistor T, a diode D whose polarity is as shown in the drawing, avalanche elements ZD3~ZD10 whose polarities are opposite to that of the diode D and a resistance Rs are sequentially connected in series. A capacitor C1 is connected parallel to the avalanche element ZD3, and a resistance R3 and a capacitor C3 are connected in series between both ends of the avalanche element ZD5. A resistance R5 and a capacitor C5 are connected parallel between both ends of the avalanche element ZD7, and a resistance R8 is connected parallel to the avalanche element ZD10.

Meanwhile, Non-Patent Document 1 has disclosed a technique of protecting a switching element from overvoltage breakdown between a gate and an emitter of the switching element by connecting a Zener diode between the gate and the emitter of the switching element. FIG. 5 shows a circuit configuration disclosed in Non-Patent Document 1.

In FIG. 5, a Zener diode 31 and a diode Ds whose polarity is as shown in the drawing are connected in series between a collector and a gate of an IGBT 50. A Zener diode 32 and a Zener diode 33 are connected in series with their polarities being opposite to each other between the gate and an emitter of the IGBT 50. Further, a gate resistance $R_{Goff}$ and a drive voltage source 34 are connected in series between the gate and the emitter of the IGBT 50. Lk denotes an inductance.

By combining circuits of FIGS. 4 and 5, it is possible to configure a circuit having both functions of overvoltage protection of a collector-emitter voltage of the switching element and overvoltage protection of a gate-emitter voltage of the switching element, as shown in FIG. 6.

In FIG. 6, a reference sign 50 denotes an IGBT as the switching element, which indicates one of a plurality of the IGBTs that are connected in series in a power conversion device. A reference sign 60 is a drive IC that outputs a gate command (a voltage of ON/OFF command) to a gate of the IGBT 50 through a gate resistance Rg.

Between a collector and a gate of the IGBT 50, avalanche elements (avalanche diodes having avalanche characteristics) D1~D5 whose polarities are as shown in the drawing and a resistance R4 are sequentially connected in series. A capacitor C1 and a resistance R1 are connected parallel between both ends of the avalanche element D4, and a capacitor C2 and a resistance R2 are connected parallel between both ends of the avalanche element D5. A Vice overvoltage protection circuit 41 is configured by these avalanche elements D1~D5, capacitors C1 and C2 and resistances R1, R2 and R4.

A cathode of a Zener diode ZD11 is connected to a common connection point of the gate of the IGBT 50 and the resistance R4. An anode of the Zener diode ZD11 is connected to an emitter of the IGBT 50 through an anode and a cathode of a Zener diode ZD12. A Vge overvoltage protection circuit 42 is configured by these Zener diodes ZD11 and ZD12.

CITATION LIST

Patent Document

Patent Document 1: Japanese Patent Publication No. 3462032
Patent Document 2: Japanese Patent Publication No. 3632385
Patent Document 3: Japanese Patent Publication No. 3598933
Patent Document 4: Japanese Patent Provisional Publication Tokkai No. 2010-124643
Patent Document 5: German Patent Publication No. DE19640433A1
Patent Document 5: German Patent Publication No. DE19740540C1

Non-Patent Document

Non-Patent Document 1: SEMIKRON Inc. HP, technical information, "IGBT and MOSFET power module" section 3.6.3.2 "overvoltage limit" Fig-3.61 (a), internet URL (http://www.semikron.com/skcompub/ja/application_manual_2000-193.htm), Oct. 24, 2013 Search

SUMMARY OF THE INVENTION

An example of a voltage waveform and a current waveform of each part in the circuit of FIG. 6 when the IGBT 50 is turned off is shown in FIG. 7. In FIGS. 6 and 7, I1 denotes a current that passes through the Vice overvoltage protection circuit 41, I2 denotes a current that branches off from I1 and flows to the gate of the IGBT, and I3 denotes a current that branches off from I1 and passes through the Vge overvoltage protection circuit 42.

First, when a voltage of an OFF command is outputted from the drive IC 60 at time t1, a gate-emitter voltage Vge of the IGBT 50 (a voltage Vd2 of the Vge overvoltage protection circuit 42) decreases, and a collector-emitter voltage Vce increases. Then, when an applied voltage Vd1 of a series circuit of the avalanche elements D1~D3 reaches a threshold value Vava1 that is determined by withstand voltage characteristics of the avalanche elements D1~D3 at time t2, the currents I1 and I2 flow through the avalanche elements D1~D3, the capacitors C1 and C2 and the resistance R4 by avalanche breakdown, and the gate-emitter voltage Vge of the IGBT 50 increases. With this, an impedance between the collector and the emitter of the IGBT 50 decreases, then balance of the collector-emitter voltage between the plurality of IGBTs connected in series is adjusted.

When an applied voltage (Vc1) of the capacitors C1 or C2 becomes a threshold value or greater during a time period t2-t3, the current I1 passing through the Vce overvoltage protection circuit 41 flows through the avalanche elements D4 and D5 connected parallel to the capacitors C1 and C2 respectively. With this, increase of the collector-emitter voltage Vce of the IGBT 50 is limited, and the overvoltage protection is performed.

Next, from time t3 when the collector-emitter voltage Vce of the IGBT 50 and the applied voltage Vd1 of the avalanche elements D1~D3 decrease and the currents I1 and I2 becomes zero, the voltage Vce and the voltage Vd1 increase again.

When the applied voltage Vd1 of the series circuit of the avalanche elements D1~D3 reaches the threshold value Vava1 determined by the withstand voltage characteristics of the avalanche elements D1~D3 again at time t4, the currents I1 and I2 flow again.

Here, the current I3 flowing through the Zener diodes ZD11 and ZD12 in the circuit of FIG. 6 is a current that flows when the applied voltage Vd2 of the ZD11 and ZD12 becomes a threshold value $V_{ZD11}$ or greater by characteristics of the ZD11 and ZD12. Further, because of a relationship of "I2=I1−I3", when the I3 flows, I2 decreases. Furthermore, a value of this I3 is also affected by variations in characteristics of the Zener diodes ZD11 and ZD12.

Considering balance (equalization) of the collector-emitter voltage Vce between the IGBTs connected in series upon the turn-off of the IGBTs, "I2=I1" is ideal. However, the fact that I3 flows by the characteristics of the ZD11 and ZD12 as described above causes variations in the current I2 of each IGBT connected in series. This causes variations in the collector-emitter voltage Vce of each IGBT 50 in a time period (mainly, in a time period T4) when the currents I1 and I3 flow. Further, this also causes variations in a collector-emitter voltage peak value Vcepeak between the IGBTs connected in series in the time period T4.

The variations in Vce brings the following problems.

(1) Vcepeak of one of the IGBTs connected in series exceeds an allowable voltage, and this entails risk that the IGBT will be broken due to Vce overvoltage breakdown.

(2) Since the time period T4 is a time period in which switching loss of the IGBT connected in series increases, there is a possibility that thermal breakdown will occur due to increase of the switching loss of one of the IGBTs. In order to avoid this thermal breakdown, it is desirable to suppress the variations in Vce for the time period T4.

The present invention was made to solve the above problems. An object of the present invention is to provide a protection circuit for a semiconductor switching element and a power conversion device which are capable of suppressing the variations in collector-emitter voltage between the semiconductor switching elements connected in series and capable of reducing the risk of breaking the semiconductor switching element due to the overvoltage breakdown and the thermal breakdown, upon turn-off of the semiconductor switching element.

In order to solve the above problems, a protection circuit for a semiconductor switching element recited in claim 1 is a protection circuit provided for each of a plurality of semiconductor switching elements connected in series, comprising: a first protection circuit configured so that a cathode of a first avalanche element is connected to a collector of the semiconductor switching element, an anode of the first avalanche element is connected to a cathode of a second avalanche element, a first capacitor and a first resistance are connected parallel to the second avalanche element, and an anode of the second avalanche element is connected to one end of a second resistance; and a second protection circuit configured so that a cathode of a third avalanche element is connected to the other end of the second resistance, an anode of the third avalanche element is connected to an emitter of the semiconductor switching element, one end of a series component of third and fourth resistances is connected to a common connection point of the second resistance and the third avalanche element, and first and second Zener diodes are connected in series with their polarities being opposite to each other between the other end of the series component of third and fourth resistances and a gate of the semiconductor switching element.

Further, a power conversion device, recited in claim 5, comprises: the protection circuit for the semiconductor switching element as claimed in any one of the preceding claims 1 to 4.

According to the above configuration, upon turn-off of the semiconductor switching element, when a collector-emitter voltage increases, a collector current can flow to a first protection circuit side by avalanche breakdown of the first and second avalanche elements. With this, the semiconductor switching element is protected from overvoltage breakdown. The second protection circuit suppresses variations in the collector-emitter voltage of each semiconductor switching element while suppressing overvoltage of a gate-emitter voltage of each semiconductor switching element.

In the protection circuit for the semiconductor switching element recited in claim 2, a second capacitor is connected parallel to the third resistance or the fourth resistance of the second protection circuit.

According to the above configuration, since a differentiating circuit is configured by parallel connection of the third resistance or the fourth resistance and the second capacitor, a slope of the gate-emitter voltage of the semiconductor switching element becomes steep, and a transient response is improved. This brings about an effect of reduction of switching loss.

In the protection circuit for the semiconductor switching element recited in claim 3, a plurality of first avalanche elements are connected in series.

In the protection circuit for the semiconductor switching element recited in claim 4, a plurality of parallel circuits, each of which is configured by the second avalanche element, the first capacitor and the first resistance being connected parallel in the first protection circuit, are connected in series.

According to the above configuration, it is possible to design an optimum circuit according to withstand voltage characteristics of each avalanche element and a circuit voltage.

(1) According to invention recited in claims 1 to 5, it is possible to suppress the variations in collector-emitter voltage between the semiconductor switching elements connected in series and to reduce the risk of breaking the semiconductor switching element due to the overvoltage breakdown and the thermal breakdown, upon turn-off of the semiconductor switching element.

(2) According to invention recited in claim 2, a slope of the gate-emitter voltage of the semiconductor switching element becomes steep, and a transient response is improved. This brings about an effect of reduction of switching loss.

(3) According to invention recited in claims 3 and 4, it is possible to design an optimum circuit according to withstand voltage characteristics of each avalanche element and a circuit voltage.

BRIEF DESCRIPTION OF THE DRAWINGS

FIG. 7 is a drawing of a voltage waveform and a current waveform of each part in the circuit of FIG. 6.

EMBODIMENTS FOR CARRYING OUT THE INVENTION

Figure 1:
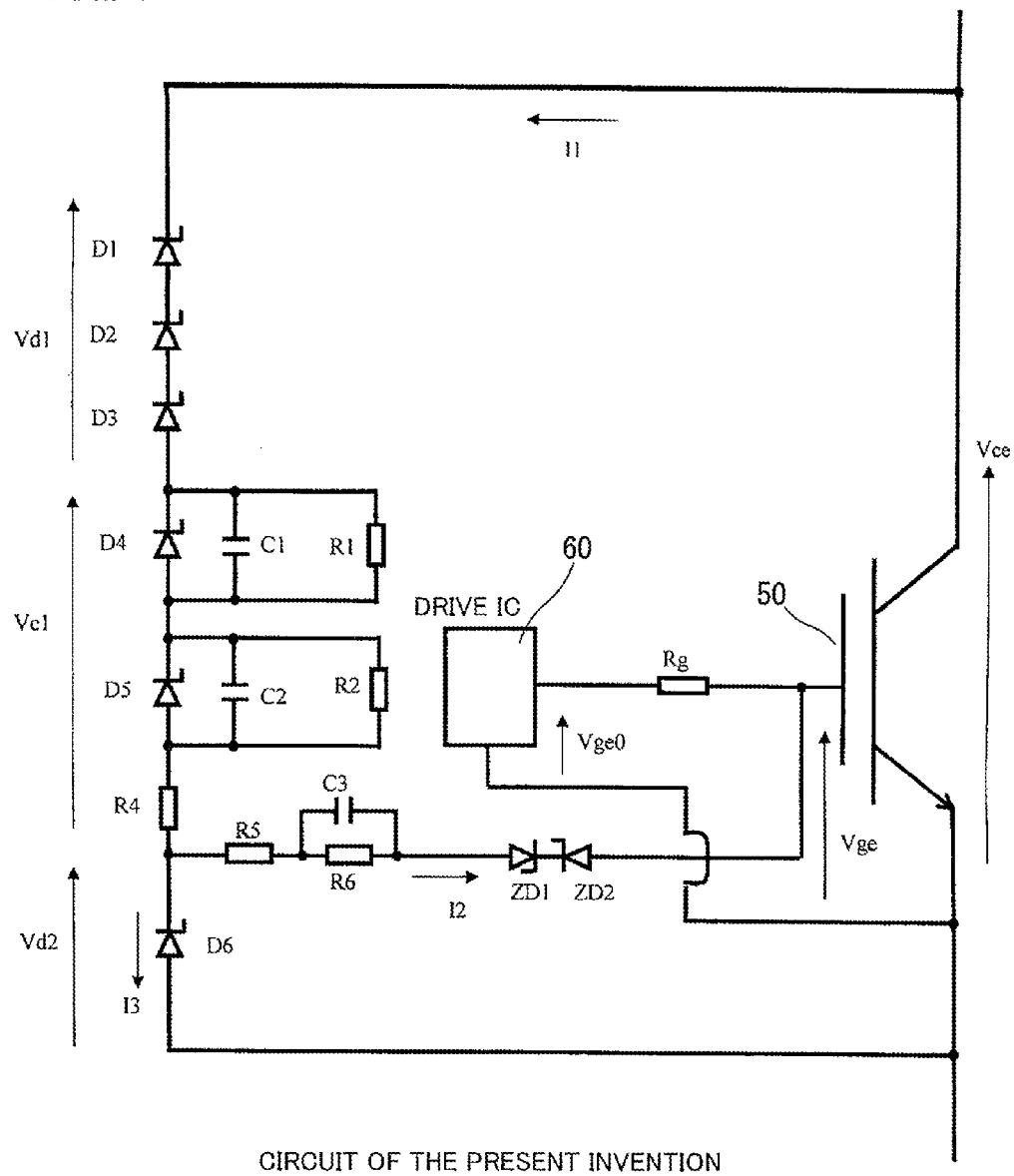
FIG. 1 is a circuit diagram of an embodiment of the present invention.
Figure 6:
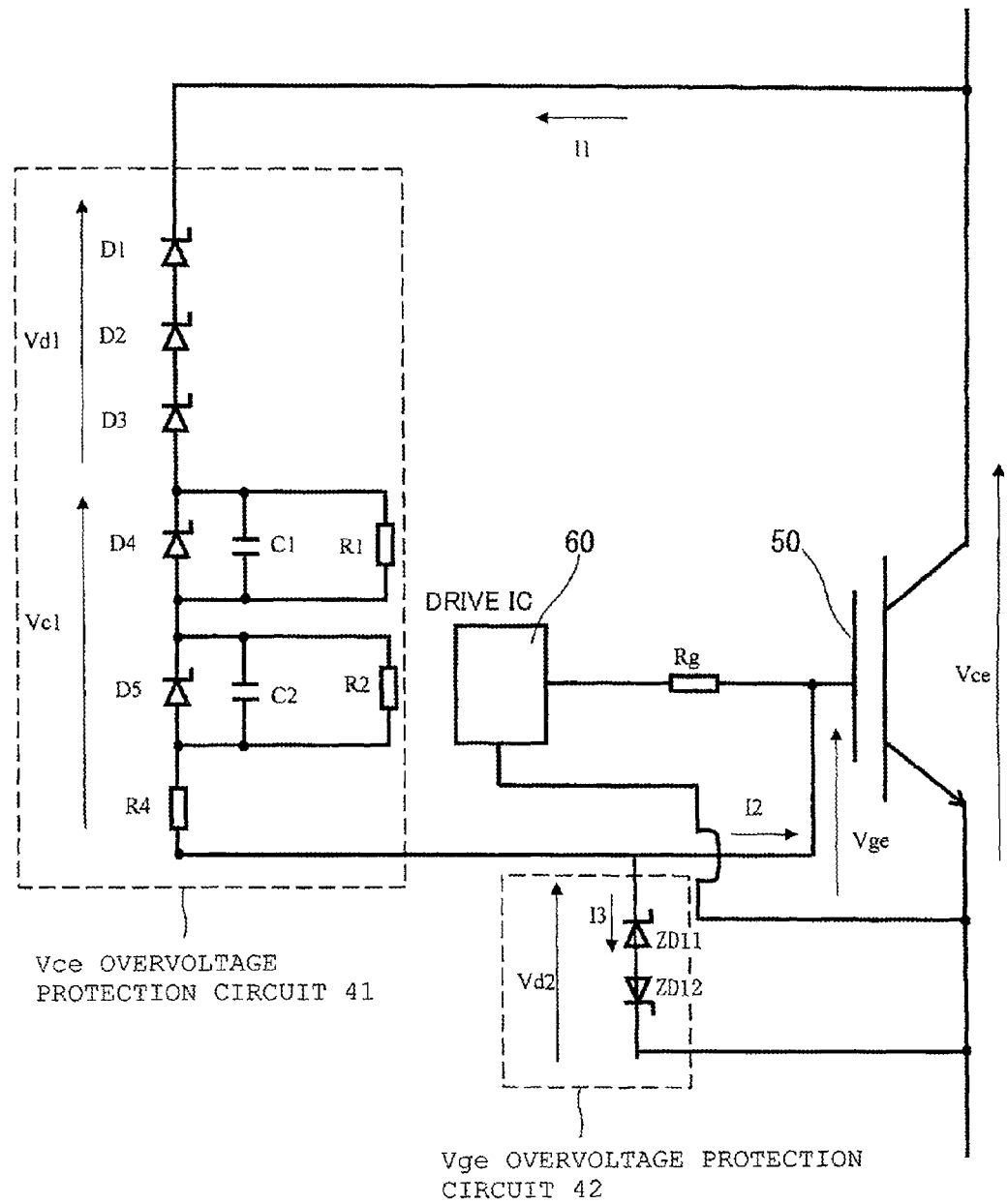
FIG. 6 is a configuration diagram of an overvoltage protection circuit configured by combining the circuits of FIGS. 4 and 5.

In the following description, embodiments of the present invention will be explained with reference to the drawings. The present invention is not limited to the following embodiments. FIG. 1 shows an embodiment in which the present invention is applied to a semiconductor switching element, which is one of semiconductor switching elements that are connected in series, in a power conversion device. The same element etc. in FIG. 1 as those in FIG. 6 are denoted by the same reference signs.

In FIG. 1, a reference sign 50 denotes an IGBT as the switching element, which indicates one of a plurality of IGBTs that are connected in series in the power conversion device. In the present embodiment, although the IGBT is used as the semiconductor switching element, the semiconductor switching element is not limited to this IGBT, and other switching elements could be used.

A reference sign 60 is a drive IC that outputs a gate command (a voltage Vge0 of ON/OFF command) to a gate of the IGBT 50 through a gate resistance Rg. In the present embodiment, "Vge0=+15V" is outputted at a time of an ON-command, and "Vge0=−10V" is outputted at a time of an OFF-command.

Between a collector and an emitter of the IGBT 50, avalanche elements (avalanche diodes having avalanche characteristics) D1~D5 whose cathodes are on a collector side of the IGBT 50, a resistance R4 and an avalanche element D6 whose cathode is on the collector side of the IGBT 50 are sequentially connected in series. A capacitor C1 and a resistance R1 are connected parallel between both ends of the avalanche element D4, and a capacitor C2 and a resistance R2 are connected parallel between both ends of the avalanche element D5.

The number of avalanche elements D1~D3 (a first avalanche element of the present invention) connected in series is determined by withstand voltage characteristics of each avalanche element and a circuit voltage. Although the number of avalanche elements connected in series is three in the present embodiment, it is not limited to three. The number of avalanche elements connected in series can be arbitrarily determined as long as it is one avalanche element or more.

Upon turn-off of the IGBT 50, when an applied voltage Vd1 of the avalanche elements D1~D3 exceeds an avalanche voltage Vava1 that is determined by characteristics of the avalanche elements D1, D2 and D3, a current I1 flows through the capacitors C1 and C2, and the capacitors C1 and C2 are charged. The current I1 normally flows through the capacitors C1 and C2. However, when an applied voltage of the capacitors C1 or C2 becomes a threshold value or greater, the current I1 also flows through the avalanche elements D4 and D5 connected parallel to the capacitors C1 and C2 respectively. As a consequence, increase of a collector-emitter voltage Vce of the IGBT 50 is limited, and overvoltage protection of Vce is performed.

The resistances R1 and R2 are resistances for discharge of electric charge accumulated in the capacitors C1 and C2. The number of parallel circuits that are connected in series, each of which is configured by the capacitor (C1 or C2 (a first capacitor of the present invention)), the avalanche element (D4 or D5 (a second avalanche element of the present invention)) and the resistance (R1 or R2 (a first resistance of the present invention)) being connected parallel, is determined by withstand voltage characteristics of each element and the circuit voltage. In the present embodiment, it is two series circuits. However, it is not limited to this, and the number of parallel circuits that are connected in series can be arbitrarily determined as long as it is one series circuit or more.

A first protection circuit of the present invention is configured by these avalanche elements D1~D5, capacitors C1 and C2 and resistances R1, R2 and R4.

One end of a resistance R5 (a third resistance of the present invention) is connected to a common connection point of the resistance R4 (a second resistance of the present invention) and the avalanche element D6 (a third avalanche element of the present invention).

The other end of the resistance R5 is connected to one end of a resistance R6 (a fourth resistance of the present invention). A capacitor C3 (a second capacitor of the present invention) is connected parallel to the resistance R6.

The other end of the resistance R6 is connected to a cathode of a Zener diode ZD2 (a second Zener diode of the present invention) through an anode and a cathode of a Zener diode ZD1 (a first Zener diode of the present invention). An anode of the Zener diode ZD2 is connected to the gate of the IGBT 50.

A second protection circuit of the present invention is configured by these resistances R5 and R6, capacitor C3, Zener diodes ZD1 and ZD2 and avalanche element D6.

The Zener diodes ZD1 and ZD2 are used for suppressing a reverse current to an output of the drive IC 60 upon turn-on of the IGBT 50 and for decreasing applied voltages applied to the resistances R5 and R6 and the capacitor C3. This decrease of the applied voltage brings about an effect of size reduction of the resistances R5 and R6 and the capacitor C3. Further, the Zener diodes ZD1 and ZD2 have the function of suppressing the overvoltage of a gate-emitter voltage Vge of the IGBT 50 together with the avalanche element D6.

The resistance R4 has the function of restraining the current I1. The resistances R5 and R6 and the capacitor C3 have the function of restraining the current I2.

Here, by using a differentiating circuit configured by the resistance R6 and the capacitor C3 being connected parallel, a slope of the gate-emitter voltage Vge of the IGBT 50 becomes steep, and a transient response is improved. This brings about an effect of reduction of switching loss.

Figure 2:
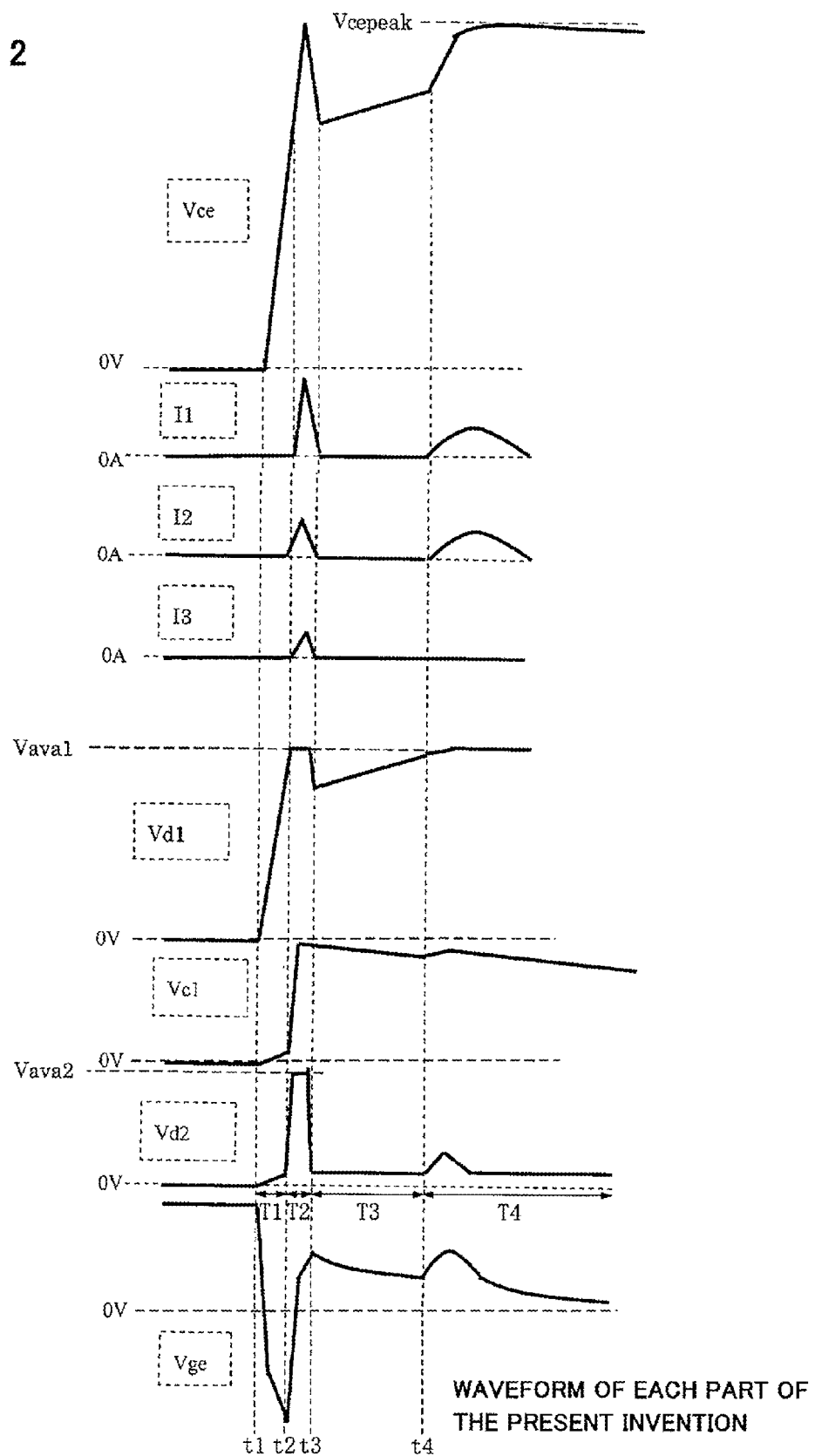
FIG. 2 is a drawing of a voltage waveform and a current waveform of each part in the circuit of FIG. 1.
Figure 3:
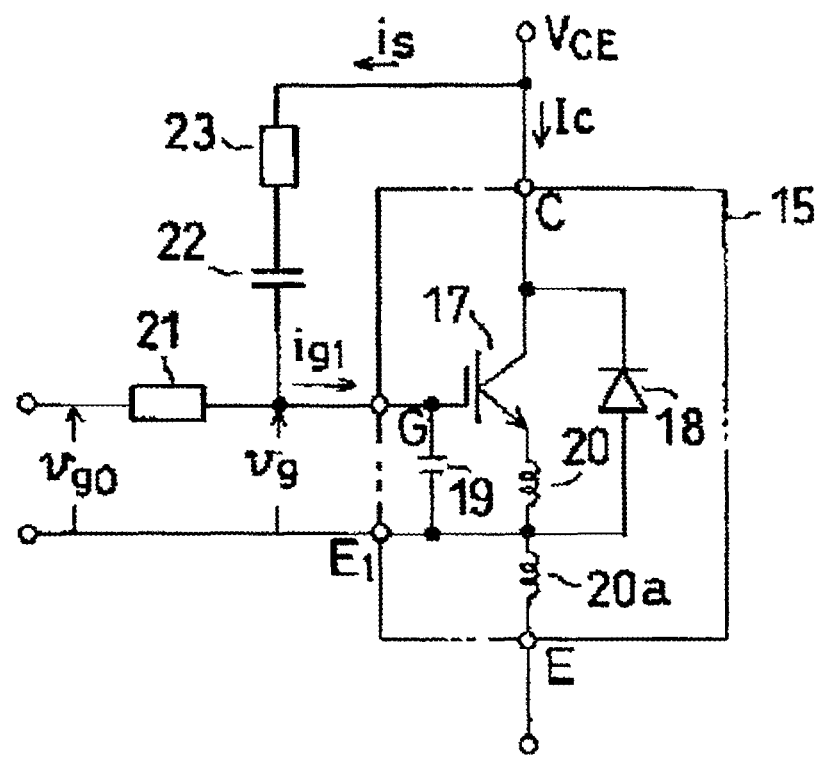
FIG. 3 is a circuit diagram showing an example of a related art protection circuit for a switching element.
Figure 4:
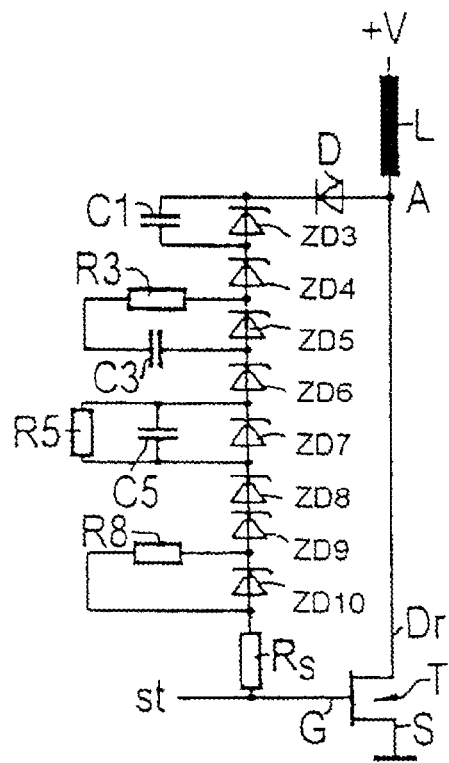
FIG. 4 is a circuit diagram showing other example of a related art protection circuit for a switching element.
Figure 5:
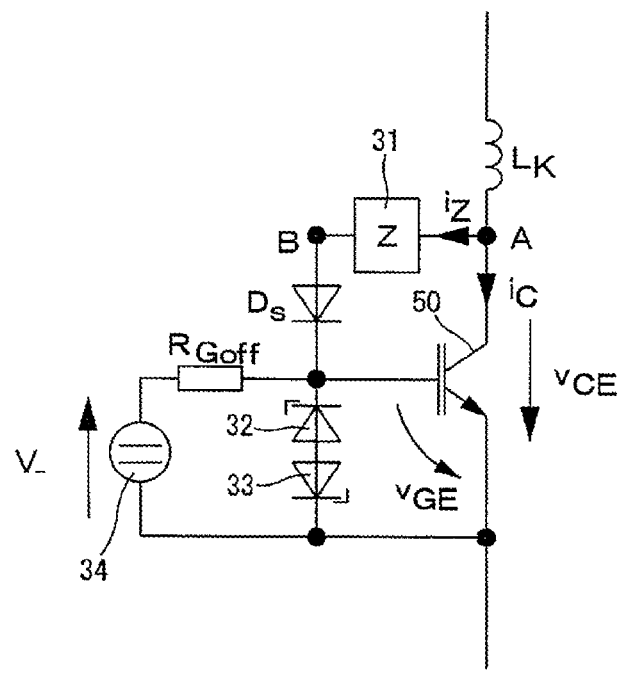
FIG. 5 is a circuit diagram showing other example of a related art protection circuit for a switching element.

An example of a voltage waveform and a current waveform of each part in the circuit of FIG. 1 when the IGBT 50 is turned off is shown in FIG. 2. In FIGS. 1 and 2, I1 denotes a current that passes through the avalanche elements D1~D5, the capacitors C1 and C2 and the resistance R4. I2 denotes a current that branches off from I1 and flows to the gate of the IGBT 50 through the resistances R5 and R6, the capacitor C3 and the Zener diodes ZD1 and ZD2. I3 denotes a current that branches off from I1 and passes through the avalanche element D6.

Next, operation in each time period in FIG. 2 will be explained below.

<Time Period T1>

First, when an output signal of the drive IC 60 becomes the OFF-command and "Vge0=−10V" is outputted at time t1, the gate-emitter voltage Vge of the IGBT 50 decreases, and the IGBT 50 is turned off. The collector-emitter voltage Vce then increases at a certain slope. With increase of the collector-emitter voltage Vice, the applied voltage Vd1 of the series circuit of the avalanche elements D1, D2 and D3 also increases.

<Time Period T2>

When Vd1 reaches the avalanche voltage Vava1 determined by the characteristics of the avalanche elements D1, D2 and D3 at time t2, the current I1 flows through the avalanche elements D1~D3, the capacitors C1 and C2 and the resistance R4 by avalanche breakdown. Then, when an applied voltage (Vc1) of the capacitors C1 or C2 becomes a threshold value or greater during a time period t2-t3, the current I1 flows through the avalanche elements D4 and D5 connected parallel to the capacitors C1 and C2 respectively. With this, increase of the collector-emitter voltage Vce of the IGBT 50 is limited, and the overvoltage protection is performed.

The current I2 flowing to the gate of the IGBT 50 flows so that a total voltage of (the applied voltage of the resistances R5+the applied voltage of the resistances R6+an applied voltage of the Zener diode ZD1+an applied voltage of the Zener diode ZD2) balances with an applied voltage Vd2 of the avalanche element D6. With this, the gate-emitter voltage Vge of the IGBT 50 increases again.

When the applied voltage Vd2 reaches an avalanche voltage Vava2 that is determined by characteristics of the avalanche element D6, the current I3 flows through the avalanche element D6. Increase of the current I2 is then restrained, and I2 shortly decreases. When the gate-emitter voltage Vge of the IGBT 50 increases to a predetermined voltage, by a relationship of a potential difference between Vd2 and Vge, I2 becomes 0 (I2=0), and I1 becomes 0 (I1=0). Because of "I1=0", I3 becomes 0 (I3=0) (at time t3).

<Time Period T3>

The gate-emitter voltage Vge of the IGBT 50, which has increased by the operation for the time period T2, gradually decreases from time t3 by a discharge operation of the drive IC 60 outputting "Vge0=−10V". Meanwhile, the collector-emitter voltage Vce of the IGBT 50 that is in turn-off increases by and with decrease of Vge. With this increase of Vce, the applied voltage Vd1 of the avalanche elements D1~D3 also increases.

<Time Period T4>

When the applied voltage Vd1 reaches the avalanche voltage Vava1 again at time t4, the current I1 flows again. Since a magnitude of the current I1 at this time is smaller than that in the time period T2, the applied voltage Vd2 of the avalanche element D6 does not reach the avalanche voltage Vava2 of the avalanche element D6, and the current does not flow to the avalanche element D6, namely "I3=0".

Therefore, the current of "I2=I1" flows, and the gate-emitter voltage Vge of the IGBT 50 increases. By the increase of the gate-emitter voltage Vge of the IGBT 50, an impedance between the collector and the emitter of the IGBT 50 decreases, then balance of the collector-emitter voltage between the IGBTs connected in series is adjusted. Further, with this adjustment, variations in a collector-emitter voltage peak value Vcepeak between the IGBTs connected in series in the time period T4 are suppressed.

As explained above, in the present invention, the current I3 does not flow in the time period T4. Thus, each current I2 of the IGBTs connected in series is not affected by the current I3. Accordingly, as compared with a related art circuit of FIG. 6 in which the current I3 flows in the time period T4, variations in the current I2 are suppressed, then the present invention has the effect of further suppressing the variations in the collector-emitter voltage Vce of each IGBT connected in series in the time period T4.

According to the present invention, it is possible to suppress the variations in the collector-emitter voltage Vce of each switching element while suppressing the overvoltage of the gate-emitter voltage Vge upon turn-off of the switching element such as the IGBT connected in series. With this, (1) it is possible to reduce the risk of breaking the switching element due to the Vice overvoltage breakdown.
(2) It is possible to suppress imbalance of switching loss of the switching element connected in series and to reduce the risk of breaking the semiconductor switching element due to the thermal breakdown.

The invention claimed is:
1. A protection circuit provided for each of a plurality of semiconductor switching elements connected in series, comprising:
    a first protection circuit configured so that a cathode of a first avalanche element is connected to a collector of the semiconductor switching element, an anode of the first avalanche element is connected to a cathode of a second avalanche element, a first capacitor and a first resistor are connected parallel to the second avalanche element, and an anode of the second avalanche element is connected to one end of a second resistor; and
    a second protection circuit configured so that a cathode of a third avalanche element is connected to the other end of the second resistor, an anode of the third avalanche element is connected to an emitter of the semiconductor switching element, one end of a series component of third and fourth resistors is connected to a common connection point of the second resistor and the third avalanche element, and first and second Zener diodes are connected in series with their polarities being opposite to each other between the other end of the series component of third and fourth resistors and a gate of the semiconductor switching element.

2. The protection circuit for the semiconductor switching element, as claimed in claim 1, wherein:
   a second capacitor is connected parallel to the third resistor or the fourth resistor of the second protection circuit.

3. The protection circuit for the semiconductor switching element, as claimed in claim 1, wherein:
   a plurality of first avalanche elements are connected in series.

4. The protection circuit for the semiconductor switching element, as claimed in claim 1, wherein:
   a plurality of parallel circuits, each of which is configured by the second avalanche element, the first capacitor and the first resistor being connected parallel in the first protection circuit, are connected in series.

5. A power conversion device comprising:
   the protection circuit for the semiconductor switching element as claimed in claim 1.

6. A power conversion device comprising:
   the protection circuit for the semiconductor switching element as claimed in claim 2.

7. A power conversion device comprising:
   the protection circuit for the semiconductor switching element as claimed in claim 3.

8. A power conversion device comprising:
   the protection circuit for the semiconductor switching element as claimed in claim 4.

\* \* \* \* \*